United States Patent
Kuroyanagi et al.

(10) Patent No.: US 7,791,111 B2
(45) Date of Patent: Sep. 7, 2010

(54) SEMICONDUCTOR DEVICE WITH AN OPENING FOR CUTTING A FUSE

(75) Inventors: Kazumasa Kuroyanagi, Kanagawa (JP); Shoji Koyama, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 146 days.

(21) Appl. No.: 11/898,016

(22) Filed: Sep. 7, 2007

(65) Prior Publication Data

US 2008/0061378 A1 Mar. 13, 2008

(30) Foreign Application Priority Data

Sep. 8, 2006 (JP) ............... 2006-244726

(51) Int. Cl.
*H01L 23/58* (2006.01)
*H01L 23/525* (2006.01)
*H01L 23/52* (2006.01)

(52) U.S. Cl. .............. 257/209; 257/529; 257/530; 257/665; 257/910; 257/E23.15; 438/132; 438/467; 438/601; 438/215; 438/281

(58) Field of Classification Search ........... 257/529, 257/E23.15, 209, 530, 665, 910; 438/132, 438/467, 601, 215, 281
See application file for complete search history.

(56) References Cited

U.S. PATENT DOCUMENTS 6,100,118 A * 8/2000 Shih et al. ............... 438/132

| | | | | |
|---|---|---|---|---|
| 6,162,686 A * | 12/2000 | Huang et al. | ............ | 438/281 |
| 6,180,503 B1 * | 1/2001 | Tzeng et al. | ............ | 438/601 |
| 6,444,544 B1 * | 9/2002 | Hu et al. | ............ | 438/467 |
| 6,531,757 B2 * | 3/2003 | Shiratake | ............ | 257/529 |
| 6,867,441 B1 * | 3/2005 | Yang et al. | ............ | 257/209 |
| 6,940,107 B1 * | 9/2005 | Cheng et al. | ............ | 257/209 |
| 7,180,154 B2 * | 2/2007 | Cho et al. | ............ | 257/529 |
| 2002/0017669 A1 * | 2/2002 | Sugiura et al. | ............ | 257/296 |
| 2004/0262768 A1 * | 12/2004 | Cho et al. | ............ | 257/758 |

FOREIGN PATENT DOCUMENTS

| JP | 64-81341 | 3/1989 |
|---|---|---|
| JP | 2-33949 | 2/1990 |
| JP | 2-244740 | 9/1990 |
| JP | 3568562 | 6/2004 |
| JP | 2006-73937 | 3/2006 |

OTHER PUBLICATIONS

Van Zant, Peter., Microchip Fabrication, 5th Edition, p. 525.*

* cited by examiner

*Primary Examiner*—Zandra Smith
*Assistant Examiner*—Tsz K Chiu
(74) *Attorney, Agent, or Firm*—McGinn IP Law Group, PLLC

(57) ABSTRACT

A semiconductor device has a plurality of fuse element portions each of which including a first fuse interconnect having a fuse to be portion, a second fuse interconnect connected to an internal circuit, a first impurity diffusion layer for electrically connecting the first fuse interconnect and the second fuse interconnect, and a second impurity diffusion layers. The first fuse interconnect, the second fuse interconnect, and the first impurity diffusion layer of each of the plurality of fuse element portions are arranged approximately parallel to one another at a predetermined pitch distance.

20 Claims, 7 Drawing Sheets

SEMICONDUCTOR DEVICE WITH AN OPENING FOR CUTTING A FUSE

This application is based on Japanese patent application NO. 2006-244726, the content of which is incorporated hereinto by reference.

BACKGROUND

1. Technical Field

The present invention relates to a semiconductor device, and, particularly, to a semiconductor device including a fuse element.

2. Related Art

In order to avoid yield reduction caused by a micro fabrication and density growth of semiconductor device, the semiconductor device has been designed to allow modification of a circuit, and switching between redundant circuits after a testing process by using a fuse circuit. As one example, a fuse element is cut by melting and evaporating caused by laser light irradiated through an opening for fuse cut on the fuse element. In the opening for fuse cut, an insulating film covering over the fuse element is thinner than other portions. Moreover, the insulating film in the portion, in which the fuse element is cut, is blown off when melting and evaporating the fuse and the fuse element is exposed. As described above, a distance between the surface of the semiconductor device and the fuse element in an insulating interlayer is smaller, or the fuse element is exposed at the surface in the portion, in which the fuse element is cut. Thereby, when the surface of the semiconductor device is electrically charged at, for example, an assembly process of the semiconductor device, electrostatic discharge easily occurs toward the fuse interconnect to cause damage of the fuse element itself, or damage by electrostatic discharge of, for example, a gate insulating film of an internal circuit connected to the fuse element. Accordingly, the reliability will be lowered.

Conventionally, there has been a problem that, when a fuse formed on a semiconductor substrate is cut by ion beam, a charged particle is irradiated onto the semiconductor device to cause charging of the semiconductor, by which an insulating film is damaged to cause failure of the semiconductor device. In order to solve the above problem, Japanese Laid-Open Patent Publication No. H02 (1990)-244740 has disclosed a semiconductor device in which at least two pn junctions are formed at a distance from each other at a position near an interconnect to be cut by ion beam, and the two pn junctions and the interconnect to be cut are electrically connected to each other.

FIG. 7 is a cross sectional view showing a configuration of the above semiconductor device. A fuse interconnect 3 as an interconnect to be cut is connected to n-type impurity diffusion layers 4 through contacts 6a and 6b at the both ends of a fuse portion to be cut 2. Here, the impurity diffusion layers 4 are isolated by element isolation insulating films 11. The impurity diffusion layers 4 forms a pn junction with a p-type semiconductor substrate 9. In the above configuration, when an ion beam is irradiated from above an insulating interlayer 8 onto the fuse to be cut 2 of the fuse interconnect 3 to increase the electric potential of the fuse interconnect 3, non-destructive breakdown of the two pn junctions is caused, and electric charges charged on the fuse interconnect 3 are discharged to the p-type semiconductor substrate 9. Thereby, charging of the semiconductor device may be prevented to avoid damage of the insulating film.

Japanese Laid-Open Patent Publication No. 2006-073937 has disclosed a semiconductor device including: a semiconductor substrate doped with first conductive-type impurities; an insulating film formed on the surface of the semiconductor substrate; a fuse formed on the insulating film; a first diffusion layer electrically connected to the fuse and formed on the surface of the semiconductor substrate by doping second conductive-type impurities; a second diffusion layer, which is connected to the substrate potential, which is formed on the surface of the above semiconductor substrate by doping the first conductive-type impurities to higher concentration than the first impurities doped to the semiconductor substrate, and which forms a diode together with the first diffusion layer and the semiconductor substrate; and a transistor electrically connected to the first diffusion layer. With this configuration, it is assumed to be possible to protect the transistor in an internal circuit from ESD surges generated on the cut surface of a redundant fuse of the semiconductor device.

Japanese Laid-Open Patent Publication No. H01 (1989)-081341 and Japanese Laid-Open Patent Publication No. H02 (1990)-033949 have disclosed a semiconductor device with a configuration in which an interconnect, connecting a fuse and an element in an internal electronic circuit and the like, is divided into two pieces and the pieces are connected to each another through a diffusion layer. With this configuration, even when the interconnect connected to the fuse is corroded by water intrusion and the like, the interconnect connected to the element in an internal electronic circuit and the like may be prevented from being corroded.

Japanese Laid-Open Patent Publication No. H07 (1995)-078872 has disclosed a technique which inhibits corrosion advancement of a metal interconnect by providing a connecting unit made of a conductive non-metallic material between a metal interconnect as a fuse and a node.

Conventionally, there has been a problem that, when a protection element is provided in order to protect a transistor in an internal circuit from ESD (Electro-Static Discharge) surges, as described in Japanese Laid-Open Patent Publication No. H02 (1990)-244740, and Japanese Laid-Open Patent Publication No. 2006-73937, a utilized area for arranging the protection element is increased.

SUMMARY

In one embodiment, there is provided a semiconductor device having: a semiconductor substrate doped with first conductive-type impurities; and a plurality of fuse element portions each of which including a first fuse interconnect having a fuse portion to be, a second fuse interconnect formed separate from the first fuse interconnect and connected to an internal circuit, a first impurity diffusion layer of a second conductive type formed on a surface of the semiconductor substrate to electrically connect the first fuse interconnect and the second fuse interconnect, and a second impurity diffusion layer of the second conductive type formed on the surface of the semiconductor substrate and provided separate from the first impurity diffusion layer, wherein the first fuse interconnect, the second fuse interconnect, and the first impurity diffusion layer of each of the plurality of fuse element portions are arranged approximately parallel to one another at a predetermined fuse pitch distance, and each of the fuse element portions having an electro-static protection, the electro-static protection including the first impurity diffusion layer, the second impurity diffusion layer, and the semiconductor substrate.

According to the above configuration, an internal circuit may be protected from ESD surge while preventing increase of an utilized area of a semiconductor device including a fuse element.

In another embodiment, there is provided a semiconductor device, including: a semiconductor substrate of a first conductive type, a first impurity diffusion layer of a second conductive type, a first fuse interconnect having a fuse portion to be cut, and a second fuse interconnect arranged separate from the first fuse interconnect and connected to an internal circuit, wherein a layer of the first fuse interconnect is different from a layer of the second fuse interconnect, and the first and second fuse interconnects couple to a first portion and a second portion different from the first portion, respectively at the first impurity diffusion layer.

According to the present invention, the internal circuit may be protected from ESD surge while preventing increase of the utilized area of the semiconductor device including the fuse element.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments according to the present invention will be explained, referring to drawings. Here, similar components will be denoted by similar reference numbers in all drawings, and detailed description will not be repeated.

First Embodiment

Figure 1:
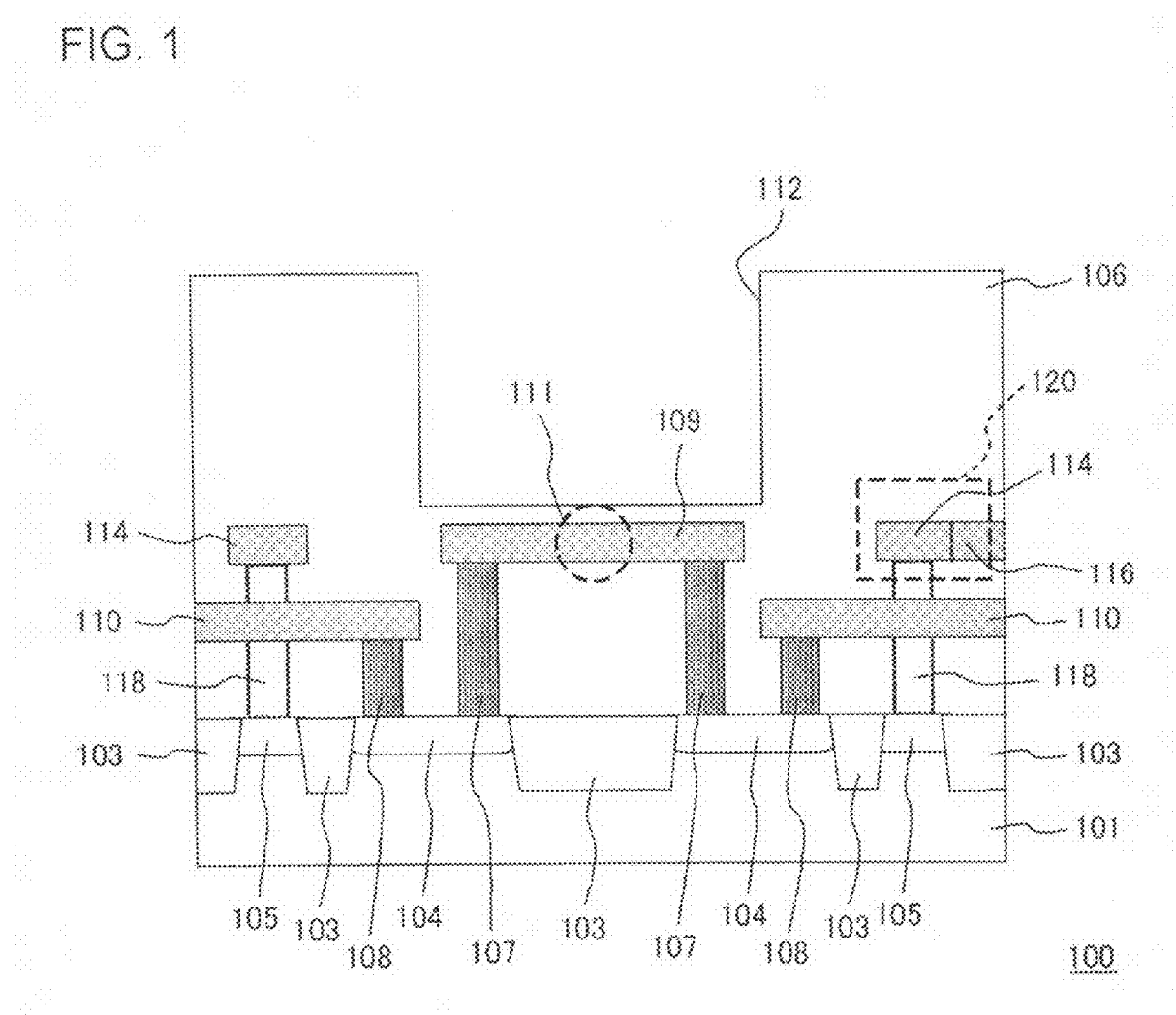
FIG. 1 is a cross sectional view showing a configuration of a semiconductor device according to an embodiment of the present invention.
Figure 2:
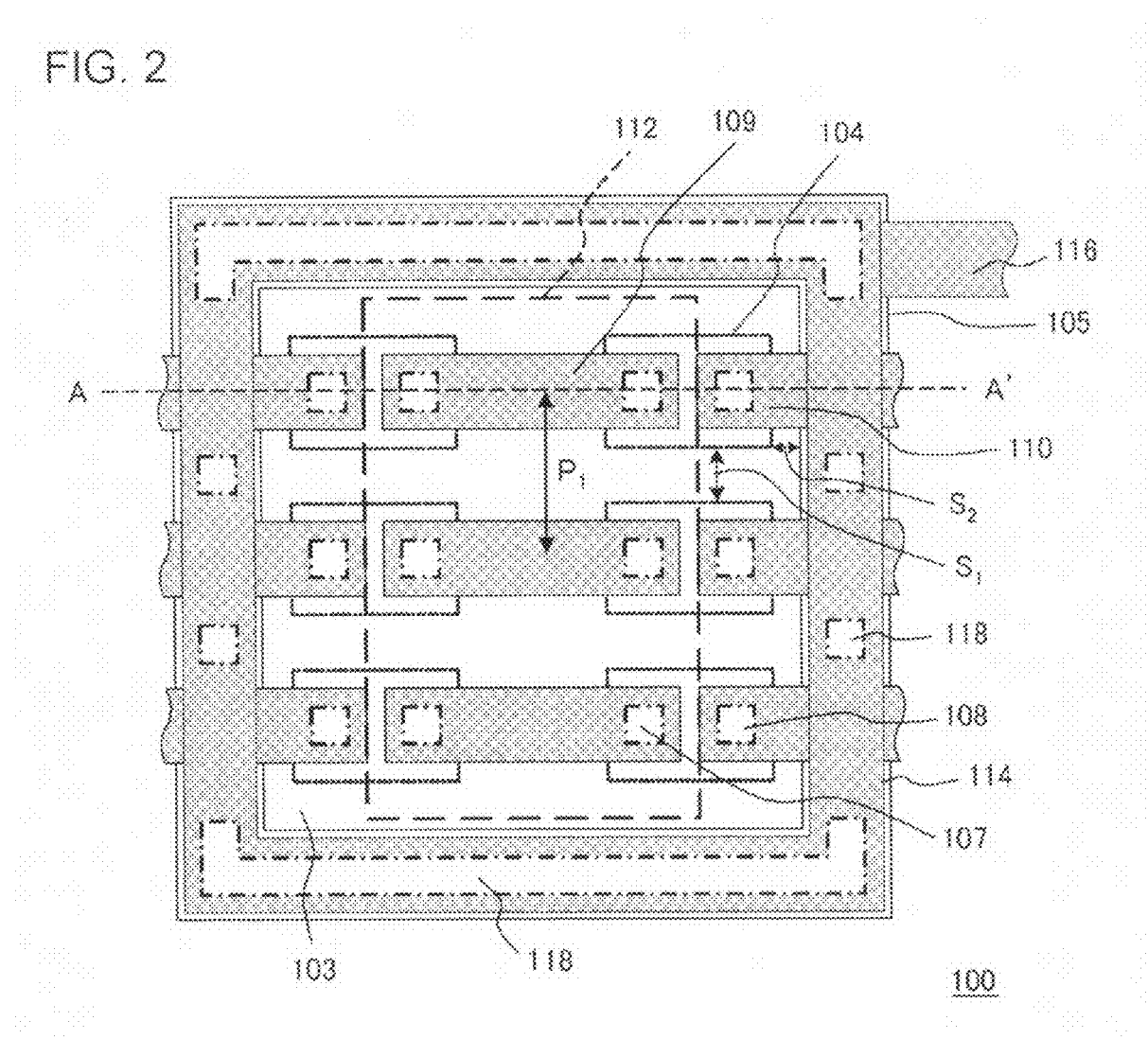
FIG. 2 is a plan view of the semiconductor device shown in FIG. 1.

FIG. 1 is a cross sectional view showing a configuration of a semiconductor device 100 according to an embodiment of the present invention. FIG. 2 is a plan view of the semiconductor device 100 shown in FIG. 1. FIG. 1 is a cross sectional view taken along the line A-A' of FIG. 2.

The semiconductor device 100 has: a semiconductor substrate 101; first impurity diffusion layers 104, second impurity diffusion layers 105, and element isolation insulating films 103 formed on a surface portion of the semiconductor substrate 101; and an insulating interlayer 106 formed above the semiconductor substrate 101. The first impurity diffusion layer 104 and the second impurity diffusion layer 105 are electrically isolated from each other by the above element isolation insulating film 103. Here, the first impurity diffusion layer 104 and the second impurity diffusion layer 105 may be n-type diffusion layers. P-type impurities are diffused in the semiconductor substrate 101.

The semiconductor device 100 further includes: first contacts 107; second contacts 108; a first fuse interconnect 109; and second fuse interconnects 110, all of which are formed in the insulating interlayer 106 on the semiconductor substrate 101. A fuse portion to be cut 111 is provided on the first fuse interconnect 109. In this embodiment, the layer of the first fuse interconnect 109 is different from the layer of the second fuse interconnect 110, and the first and second fuse interconnects 109 and 110 couple to a first portion and a second portion different from the first portion, respectively at the first impurity diffusion layer 104. Here, the first fuse interconnect 109 is formed higher layer than the second fuse interconnect 110.

In the insulating interlayer 106, an opening for fuse cut 112 is formed on the fuse portion to be cut 111. Thereby, the fuse portion to be cut 111 of the first fuse interconnect 109 may be easily cut. Though not shown in the drawings, the second fuse interconnect 110 is connected to an internal circuit in the semiconductor device 100 at a side of one end in the opposite of the other end, which is connected to the second contact 108.

The first fuse interconnect 109 is electrically connected to the second fuse interconnect 110 through the first contact 107, the first impurity diffusion layer 104, and the second contact 108. Water intruding from the fuse portion to be cut 111 of the first fuse interconnect 109 may be prevented from intruding into the side of the internal circuit through the interconnect with the configuration in which the first fuse interconnect 109 and the second fuse interconnect 110 are connected to each other through the first impurity diffusion layer 104 as described above.

The semiconductor device 100 further includes: a third contacts 118; interconnects 114; and a Vss interconnect 116, all of which are formed in the insulating interlayer on the semiconductor substrate 101. The second impurity layer 105 is connected to the Vss interconnect 116 through the third contact 118 and the interconnect 114.

In the above configuration, the first fuse interconnect 109, one of the second fuse interconnects 110, one of the first impurity diffusion layers 104, and one of the second impurity diffusion layers 105 form a fuse element portion. The semiconductor device 100 includes a plurality of the above fuse element portions. And, the semiconductor device 100 shown in FIG. 1 has a left-right symmetric configuration. That is, to the both ends of the first fuse interconnect 109, each of the first contacts 107, each of the impurity diffusion layers 104, each of the second contacts 108, and each of the second fuse interconnects 110 are connected in this order. And, the second impurities layer 105 is arranged outside the first impurity diffusion layer 104.

Referring to FIG. 2, the first fuse interconnects 109, the second fuse interconnects 110, the first impurity diffusion layers 104, and the second impurity diffusion layers 105 of each of the fuse element portions are formed in a single straight line in a plan view. Here, the first fuse interconnect 109 and the second fuse interconnects 110 of each of the fuse element portions are formed straight. As for each of the fuse element portions, the first impurity diffusion layer 104 and the second impurity diffusion layer 105 are formed on a line in the longitudinal direction of the first fuse interconnect 109 in a plan view. Further, as for each of the fuse element portions, the first fuse interconnect 109 and the second fuse interconnect 110 have substantially the same interconnect width.

In the present embodiment, a plurality of combinations of the first fuse interconnect 109 and the second fuse interconnect 110 are arranged approximately parallel to one another at a predetermined fuse pitch $P_1$. Here, the fuse pitch $P_1$ is decided to be a distance, with which no influence is caused on adjacent fuse element portions when a first fuse interconnect 109 in a certain fuse element portion is cut with a laser or the like. Here, the influence means, for example, a phenomenon that a material contained in the first fuse interconnect 109 is scattered to the surroundings by the heat of the laser to cause a short between the first fuse interconnect 109 and another first fuse interconnect 109 of another fuse element portion. At this time, the fuse pitch $P_1$ may be decided, also considering a misalignment margin while laser irradiation. A plurality of the first impurities layers 104 are also arranged approximately parallel to one another at the predetermined fuse pitch $P_1$. And, the second impurity diffusion layer 105 is commonly provided among the plurality of the fuse element portions. In the present embodiment, the second impurity diffusion layer 105 is formed in a ring surrounding a region in which the first impurity diffusion layers 104 are formed. The interconnect 114 (metal interconnect) is connected to the second impurity diffusion layer 105 through the third contact 118, and is arranged at a position above the second impurity diffusion layer 105. In the present embodiment, the interconnect 114 formed above the second impurity diffusion layer 105 is also formed in a ring similarly to the second impurity diffusion layer 105. The third contact 118 and the interconnect 114 surround a region in which the first fuse interconnects 109 and the first impurity diffusion layers 104 are formed, and functions as a guard ring layer 120 (see FIG. 1) for discharging static electricity generated in the vicinity of the surface layer to the substrate.

The second impurity diffusion layer 105 and the interconnect 114 are connected to each other through the third contacts 118 in a portion in which the third contacts 118 do not two-dimensionally overlap the second fuse interconnect 110. Here, the semiconductor substrate 101, the first impurity diffusion layer 104, and the second impurity diffusion layer 105 form an electro-static protection element of an NPN bipolar device. The interconnect 114 is connected to the grounded Vss interconnect 116. That is, a ground potential is supplied to the second impurity diffusion layer 105. A fuse circuit potential is given to the first impurity diffusion layers 104.

A distance $S_1$ between first impurity diffusion layers 104 of fuse element portions, which are adjacent to each other, may be decided, considering the fuse pitch $P_1$ for the fuse interconnects 109 and the second fuse interconnects 110, and an ability required for an electro-static protection element. However, in the present embodiment, the distance $S_1$ is decided within a range causing no influences on the fuse pitch $P_1$ decided by the above-described method. That is, in the present embodiment, first, the fuse pitch $P_1$ is decided in consideration of a margin required when the first fuse interconnect 109 is cut by a laser, and the like as described above. Subsequently, the width of the first impurity diffusion layer 104 and the distance $S_1$ are decided within a range causing no change in the decided fuse pitch $P_1$.

A bipolar transistor with a desired ability may be obtained by appropriate control of a distance $S_2$ between the first impurity diffusion layer 104 and the second impurity diffusion layer 105. For each fuse element portion, the distance $S_2$ between the first impurity diffusion layer 104 and the second impurity diffusion layer 105 may be decided in consideration of an ability required for an electro-static protection element composed of the above layers. Here, the distance $S_2$ corresponds to a base length of the NPN bipolar element. By providing the above electro-static protection element between the first fuse interconnect 109 and the second fuse interconnect 110, the fuse element itself and the internal circuit element may be prevented from damage even when the first fuse interconnect 109, which is a fuse element, is charged.

Figure 3:
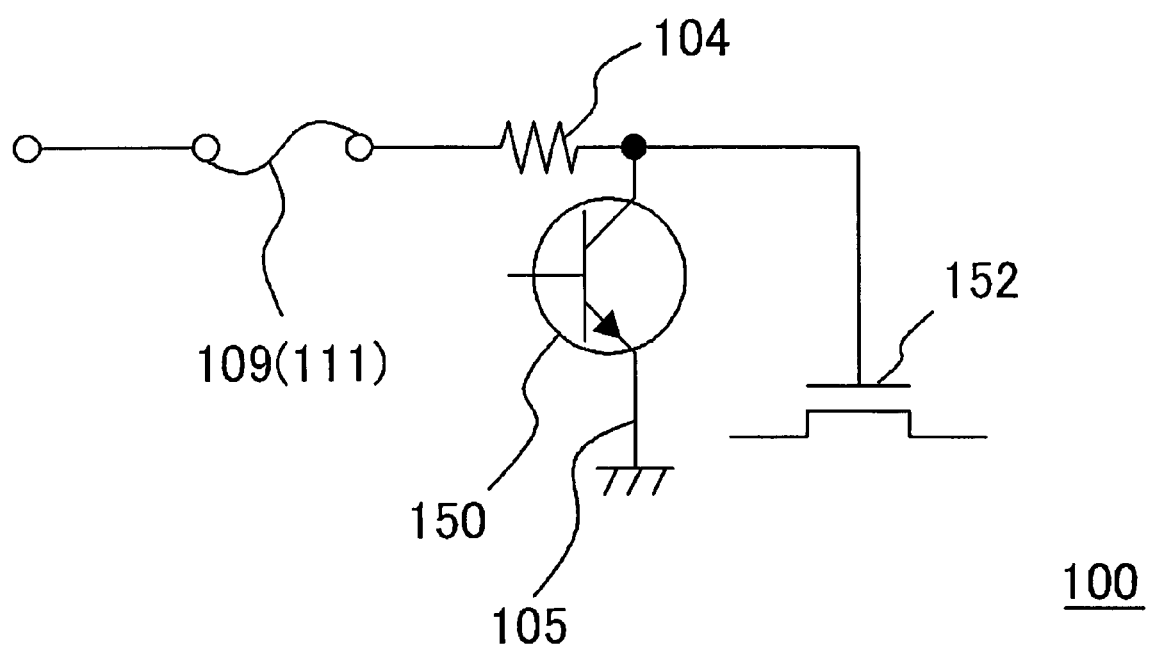
FIG. 3 is a view showing a circuit configuration of the semiconductor device shown in FIG. 1 and FIG. 2.

FIG. 3 is a view showing a circuit configuration of the semiconductor device shown in FIG. 1 and FIG. 2.

The semiconductor device 100 includes a protection element 150 composed of the impurity diffusion layer 104, the semiconductor substrate 101, and the second impurity diffusion layer 105. Here, the protection element 150 is an NPN bipolar transistor. And, the semiconductor device 100 further includes a transistor 152 forming an internal circuit. The transistor 152 forms a predetermined function circuit. In the above configuration, parasitic diode, between the first impurity diffusion layer 104 (a collector in FIG. 3) and the semiconductor substrate 101, forming the protection element 150, causes current flow when the first fuse interconnect 109 is charged negative to the substrate potential of the semiconductor substrate 101. On the other hand, the protection element 150 turns on and current flows when the first fuse interconnect 109 is charged positive to the substrate potential. Thereby, a potential difference between the first fuse interconnect 109 and the semiconductor substrate 101 may be prevented no matter which the first fuse interconnect 109 is charged: positive or negative to the substrate potential. Accordingly, the potential difference between a gate electrode of the transistor 152 connected to the first fuse interconnect 109 and the semiconductor substrate 101 may be also prevented, and thus a gate insulating film may be prevented from damage.

According to the semiconductor device 100 in the present embodiment, the first impurity diffusion layers 104 of the plurality of fuse element portions are arranged parallel to one another at the fuse pitch $P_1$ to eliminate a necessity for providing a special protection element region in addition to the fuse element portion. Accordingly, an increase in the utilized area for the fuse circuit may be minimized.

Furthermore, the above electro-static protection element may be formed without requiring an additional footprint by providing the second impurity diffusion layer 105 commonly used among a plurality of the fuse element portions. Moreover, the second impurity diffusion layer 105 is formed in a ring and over the second impurity diffusion layer 105, the guard ring is formed with the interconnect 114 and the like. Thereby, a parasitic element may be prevented from being formed between the first impurity diffusion layer 104 formed in the fuse element portion and the diffusion layer formed in the internal circuit.

Second Embodiment

Figure 4:
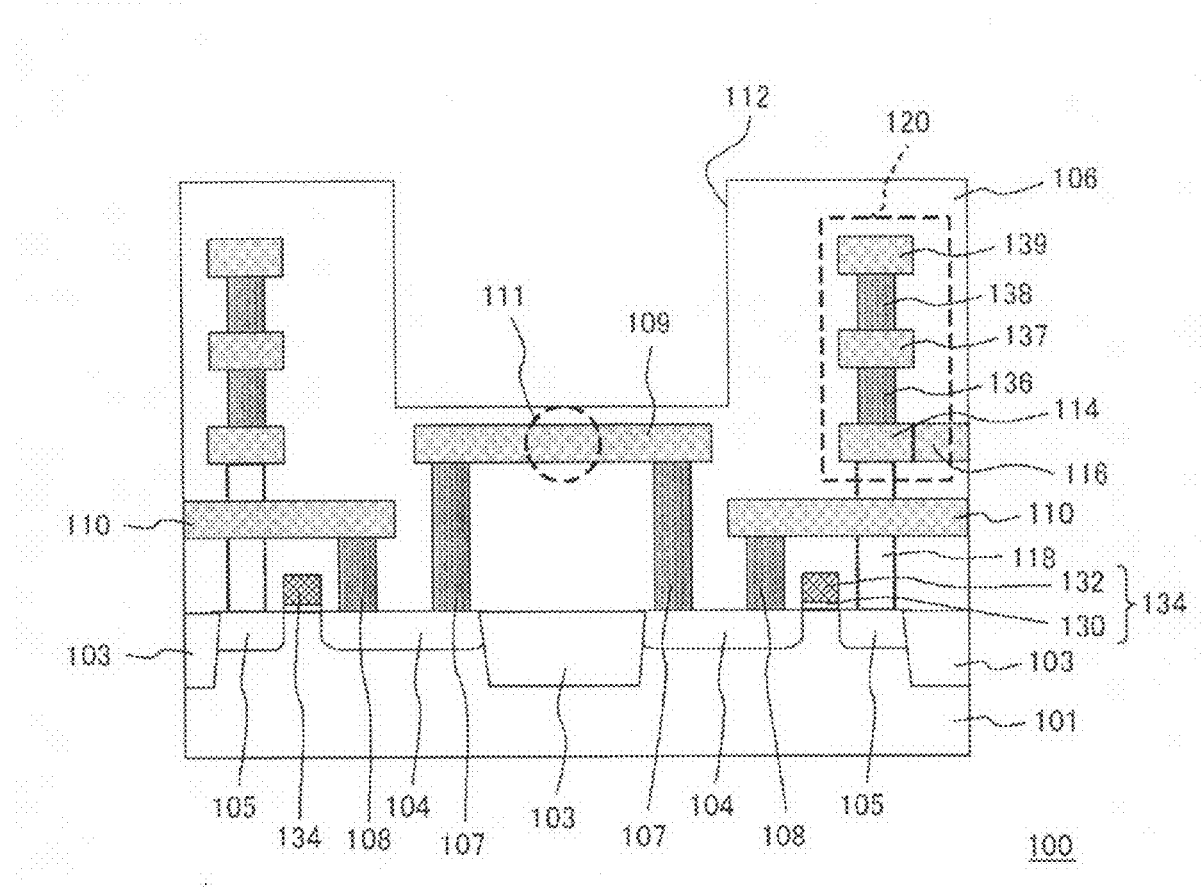
FIG. 4 is a cross sectional view showing a configuration of a semiconductor device according to an embodiment of the present invention.
Figure 5:
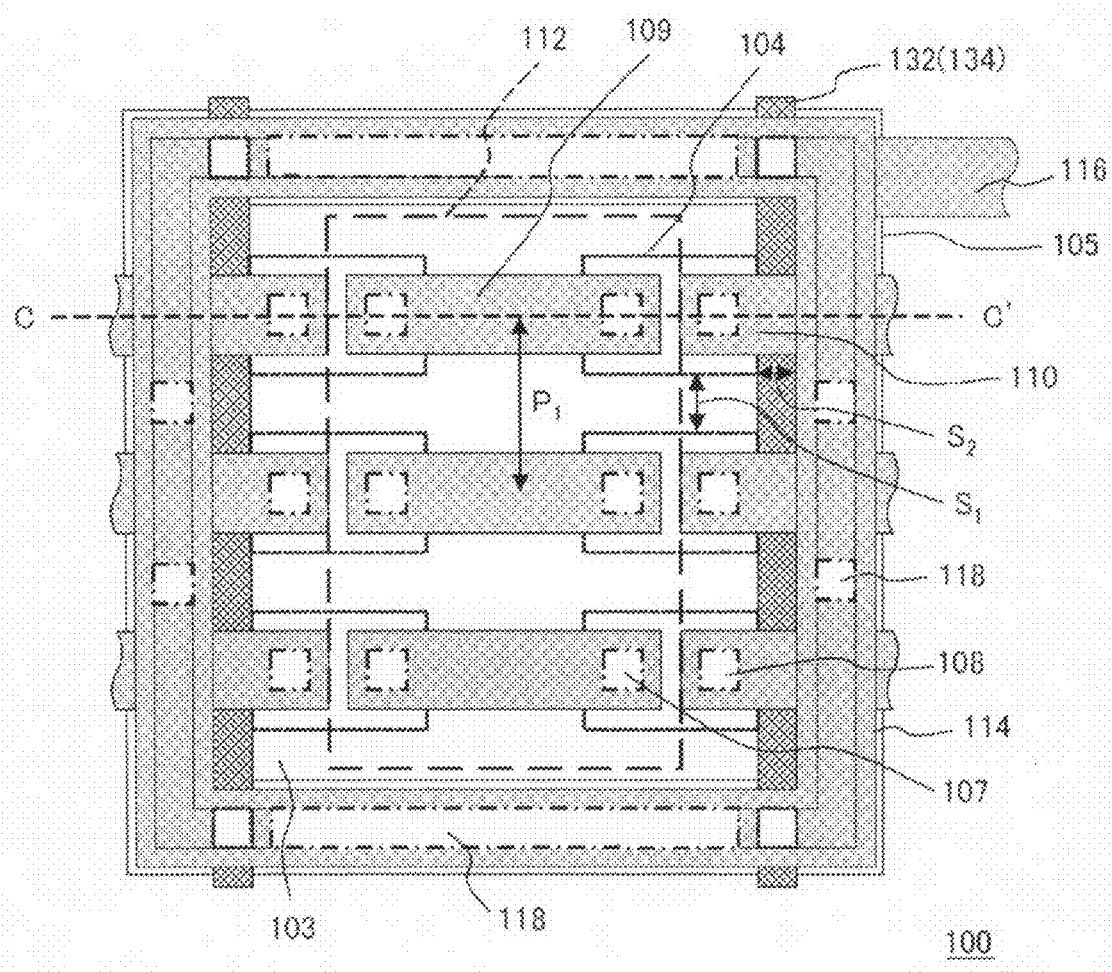
FIG. 5 is a plan view of the semiconductor device shown in FIG. 4.

FIG. 4 is a cross sectional view showing a configuration of a semiconductor device 100 according to the embodiment of the present invention. FIG. 5 is a plan view of the semiconductor device 100 shown in FIG. 4. FIG. 4 is a cross sectional view of the semiconductor device 100 taken along the line C-C' of FIG. 5.

Hereinafter, only different configuration from the semiconductor device 100, shown in FIG. 1, according to the first embodiment will be explained. In the present embodiment, an element isolation insulating film 103 is not provided between a first impurity diffusion layer 104 and a second impurity diffusion layer 105, and instead, a p-type impurity region is provided by a semiconductor substrate 101. A gate 134 composed of a gate insulating film 130 and a gate electrode 132 is formed on the above p-type impurity region. The first impurity diffusion layer 104, the gate 134, and the second impurity diffusion layer 105 form an electro-static protection element of an NMOS transistor. In the present embodiment, a distance $S_2$ between the first impurity diffusion layer 104 and the second impurity diffusion layer 105 corresponds to a channel length of the NMOS transistor. Accordingly, the NMOS transistor may have a desired ability by control of the distance $S_2$.

The semiconductor device 100 further includes: a contact 136 connected to an interconnect 114; an interconnect 137; a contact 138; and an interconnect 139. The interconnect 114, the contact 136, the interconnect 137, the contact 138, and the interconnect 139 are formed in a ring similarly to the second impurity diffusion layer 105, and function as a guard ring 120. For example, by providing another electrode connected to the diffusion layer in the vicinity of the first fuse interconnect 109 and on a side of the first fuse interconnect 109 closer to the surface of the semiconductor device 100, that is, above the first fuse interconnect 109 in FIG. 4, the first fuse interconnect 109 may be less charged even when the first fuse interconnect 109 is charged due to water and the like. Moreover, when the above another electrode is provided, discharge occurs between an external apparatus, such a collet used while assembly processing, and the another electrode so as to prevent discharge between the first fuse interconnect 109 and the external apparatus.

Figure 6:
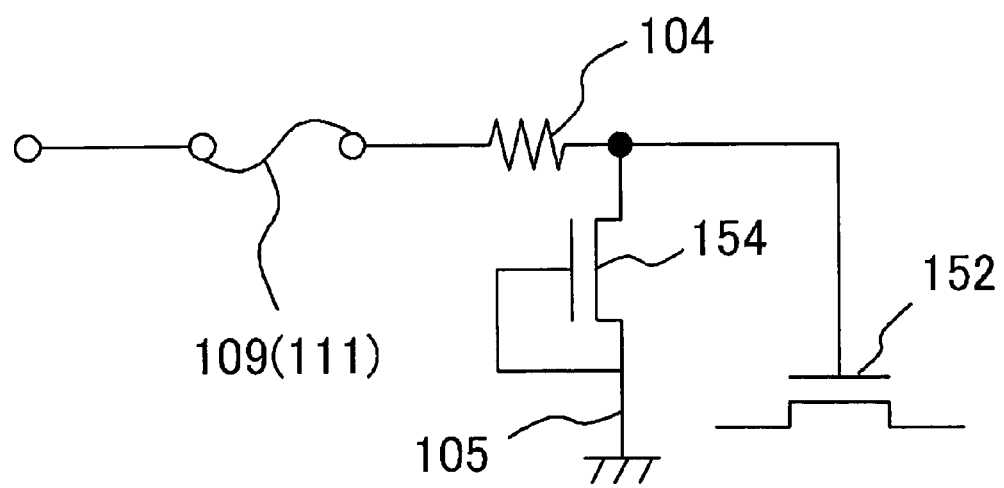
FIG. 6 is a view showing a circuit configuration of the semiconductor device shown in FIG. 4 and FIG. 5.
Figure 7:
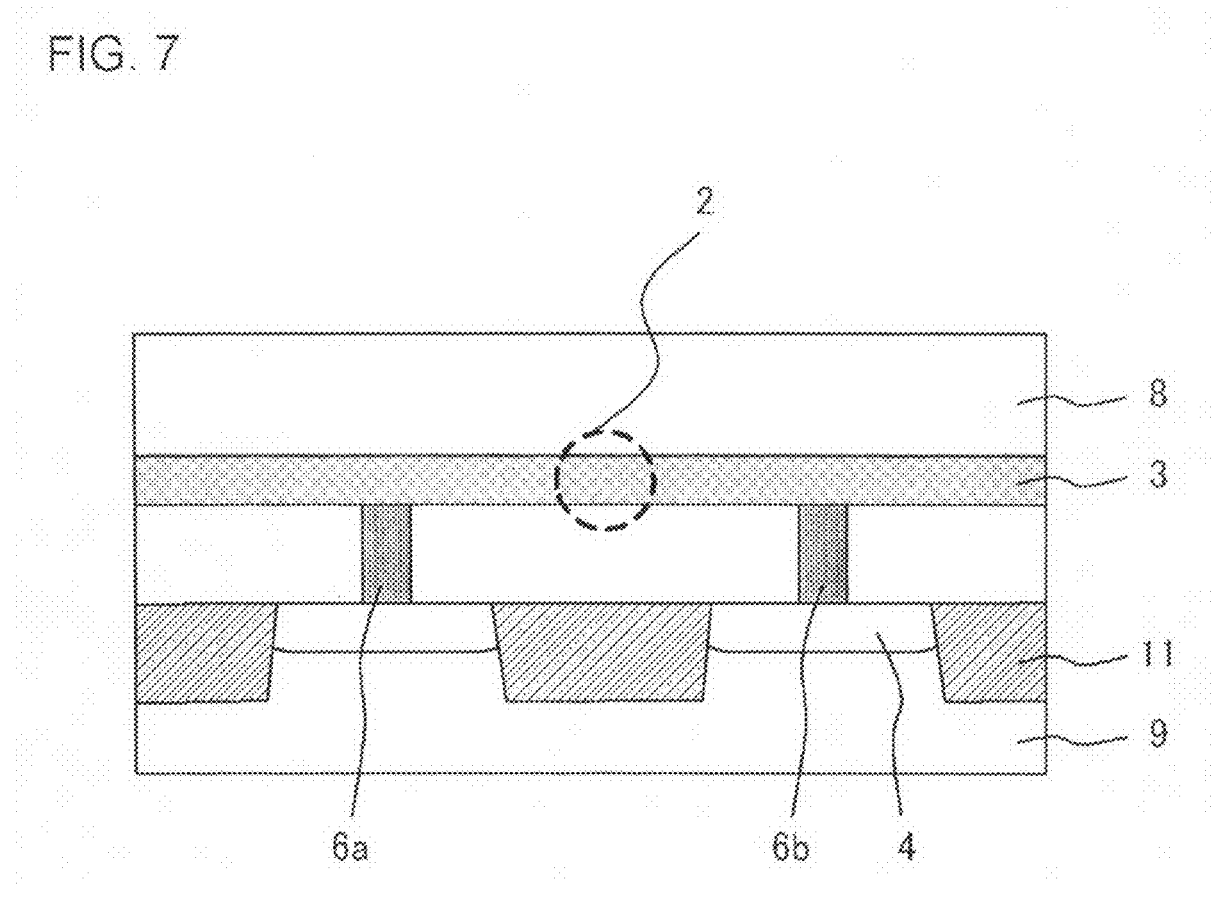
FIG. 7 is a cross sectional view showing a configuration of a conventional semiconductor device.

FIG. 6 is a view showing a circuit configuration of the semiconductor device shown in FIG. 4 and FIG. 5.

The semiconductor device 100 includes a protection element 154 of the above-described NMOS transistor. In the above configuration, a parasitic diode, between the first impurity diffusion layer 104 and the semiconductor substrate 101, forming the protection element 154, causes current flow when the first fuse interconnect 109 is charged negative to the substrate potential of the semiconductor substrate 101. On the other hand, the protection element 154 turns on and current flows when the first fuse interconnect 109 is charged positive to the substrate potential. Thereby, a potential difference between the first fuse interconnect 109 and the semiconductor substrate 101 may be prevented no matter which the first fuse interconnect 109 is charged: positive or negative to the substrate potential. Accordingly, the potential difference between a gate electrode of the transistor 152 connected to the first fuse interconnect 109 and the semiconductor substrate 101 may be also prevented, and thus a gate insulating film may be prevented from damage. As described in the present embodiment, the protection element 154 may be operated with a clamp voltage even lower than that required for the NPN protection element 150 shown in FIG. 3 by a configuration with the gate voltage of the protection element 154 set to the ground potential.

As described above, according to the semiconductor device 100 of the present embodiment, reliability of a circuit electrically connected to the fuse element, or an internal circuit adjacent to the fuse element may be secured while keeping an increase in the utilized area for the circuit minimum.

Though the embodiments according to the present invention have been described above, referring to the drawings, the above embodiments are to be considered as illustrative of the present invention, and various kinds of configurations as well as the above-described ones may be adopted.

Here, the opening for fuse cut 112 is commonly provided among a plurality of the fuse element portions in the above-described embodiments. However, an opening (fuse window) for fuse cut may be provided for each of the fuse element portions in another example. In this case, the fuse pitch $P_1$ for the first fuse interconnect 109 may be decided, based on the size of the opening for fuse cut.

It is apparent that the present invention is not limited to the above embodiment, and may be modified and changed without departing from the scope and spirit of the invention.

What is claimed is:

1. A semiconductor device, comprising:
   a semiconductor substrate doped with first conductive-type impurities; and
   a plurality of fuse element portions, each of which include a first fuse interconnect having a fuse portion to be cut, a second fuse interconnect formed separate from the first fuse interconnect and connected to an internal circuit, a first impurity diffusion layer of a second conductive-type formed on a surface of said semiconductor substrate to electrically connect said first fuse interconnect and said second fuse interconnect, and a second impurity diffusion layer of the second conductive-type formed on the surface of said semiconductor substrate and provided separate from said first impurity diffusion layer,
   wherein said first fuse interconnect, said second fuse interconnect, and said first impurity diffusion layer of each of said plurality of fuse element portions are arranged approximately parallel to one another at a predetermined fuse pitch distance, and
   wherein each of said fuse element portions has an electro-static protection, said electro-static protection including said first impurity diffusion layer, said second impurity diffusion layer, and said semiconductor substrate.

2. The semiconductor device as claimed in claim 1, wherein, in each of said fuse element portions, said first fuse interconnect, said second fuse interconnect, said first impurity diffusion layers, and said second impurity diffusion layers are formed on a single straight line in a plan view.

3. The semiconductor device as claimed in claim 1, wherein, in each of said fuse element portions, said first impurity diffusion layer and said second impurity diffusion layer are formed on a line in a longitudinal direction of said first fuse interconnect in a plan view.

4. The semiconductor device as claimed in claim 2, wherein, in each of said fuse element portions, said first impurity diffusion layer and said second impurity diffusion layer are formed on a line in a longitudinal direction of said first fuse interconnect in a plan view.

5. The semiconductor device as claimed in claim 1, wherein said second impurity diffusion layer of each of said fuse element portions is formed extending toward said second impurity diffusion layer of an adjacent other fuse element portion, and is connected to said second impurity diffusion layer of said adjacent other fuse element portion.

6. The semiconductor device as claimed in claim 1, wherein, in each of said fuse element portions, a pair of said second fuse interconnects, a pair of said first impurity diffusion layers, and a pair of said second impurity diffusion layers are respectively provided at one end and the other end of said first fuse interconnect, and said second impurity diffusion layers are formed in a ring surrounding a region in which said plurality of fuse element portions are formed, and is commonly provided among said plurality of fuse element portions.

7. The semiconductor device as claimed in claim 5, wherein, in each of said fuse element portions, a pair of said second fuse interconnects, a pair of said first impurity diffusion layers, and a pair of said second impurity diffusion layers are respectively provided at one end and the other end of said first fuse interconnect, and said second impurity diffusion layers are formed in a ring surrounding a region in which said plurality of fuse element portions are formed, and is commonly provided among said plurality of fuse element portions.

8. The semiconductor device as claimed in claim 1, wherein, in each of said fuse element portions, said first impurity diffusion layer and said second impurity diffusion layer, together with said semiconductor substrate, form a bipolar transistor.

9. The semiconductor device as claimed in claim 1, wherein, in each of said fuse element portions, an impurity diffusion region of the first conductive-type formed by said semiconductor substrate is provided between said first impurity diffusion layer and said second impurity diffusion layer, a gate electrode is formed on said impurity diffusion region of the first conductive-type, and said first impurity diffusion layer and said second impurity diffusion layer, together with said semiconductor substrate and said gate electrode, form a MOS transistor.

10. The semiconductor device as claimed in claim 1, wherein a metal interconnect connected to said second impurity diffusion layer through a contact is arranged at a position above said second impurity diffusion layer.

11. A semiconductor device, comprising:
a semiconductor substrate of a first conductive-type;
a first impurity diffusion layer of a second conductive-type; and
a first fuse interconnect having a fuse portion to be cut, and a second fuse interconnect arranged separate from the first fuse interconnect and connected to an internal circuit,
wherein a layer of said first fuse interconnect is different from a layer of said second fuse interconnect, and said first and second fuse interconnects couple to a first portion and a second portion different from said first portion, respectively at the first impurity diffusion layer.

12. A semiconductor device as recited in claim 11, wherein the first impurity diffusion layer and the semiconductor substrate comprise a protection element.

13. A semiconductor device as recited in claim 12, wherein the protection element causes current to flow when the first fuse interconnect is charged negative to a substrate potential of the semiconductor substrate.

14. A semiconductor device as recited in claim 12, wherein the protection element causes current to flow when the first fuse interconnect is charged positive to the substrate potential of the semiconductor substrate.

15. A semiconductor device, comprising:
a semiconductor substrate;
a first impurity diffusion layer provided on the semiconductor substrate;
a second impurity diffusion layer provided on the semiconductor substrate;
an element isolation film formed on a surface of the semiconductor substrate configured to electrically isolate the first impurity diffusion layer and the second impurity diffusion layer;
a fuse portion provided on a fuse interconnect, said fuse interconnect being associated with the first impurity diffusion layer; and
a contact configured to associate the fuse portion with the first impurity diffusion layer,
wherein the semiconductor substrate, the first impurity diffusion layer, and the second impurity diffusion layer comprise an electro-static protection element of an NPN bipolar device.

16. A semiconductor device as recited in claim 15, further comprising a gate electrode associated with a first fuse interconnect.

17. A semiconductor device as recited in claim 15, wherein the element isolation film is provided inside a portion of the semiconductor substrate below the surface of the semiconductor substrate.

18. A semiconductor device as recited in claim 15, wherein the first diffusion layer is separated from the second diffusion layer by a distance, said distance comprising a base length of the NPN bipolar element.

19. A semiconductor device as recited in claim 15, further comprising a second fuse interconnect, said second fuse interconnect being arranged approximately parallel to the first fuse interconnect, said second fuse interconnect being associated with the first impurity diffusion layer through a second contact portion and associated with the second impurity diffusion layer through a third contact, said third contact being in a portion in which the third contact does not overlap the second fuse interconnect.

20. A semiconductor device as recited in claim 15, wherein a parasitic diode is formed between the first impurity diffusion layer and the semiconductor substrate, said parasitic diode comprising the protection element to cause current to flow when a first fuse interconnect is charged to the substrate potential of the semiconductor substrate.

* * * * *